(12) United States Patent
Li et al.

(10) Patent No.: US 11,075,056 B2
(45) Date of Patent: Jul. 27, 2021

(54) SCANNING ELECTRON MICROSCOPE OBJECTIVE LENS SYSTEM AND METHOD FOR SPECIMEN OBSERVATION

(71) Applicant: Focus-eBeam Technology (Beijing) Co., Ltd., Beijing (CN)

(72) Inventors: Shuai Li, Beijing (CN); Wei He, Beijing (CN)

(73) Assignee: Focus-eBeam Technology (Beijing) Co., Ltd., Beijing (CN)

( * ) Notice: Subject to any disclaimer, the term of this patent is extended or adjusted under 35 U.S.C. 154(b) by 599 days.

(21) Appl. No.: 15/779,763

(22) PCT Filed: May 2, 2018

(86) PCT No.: PCT/CN2018/085300
§ 371 (c)(1),
(2) Date: May 29, 2018

(87) PCT Pub. No.: WO2019/100663
PCT Pub. Date: May 31, 2019

(65) Prior Publication Data
US 2021/0110994 A1   Apr. 15, 2021

(30) Foreign Application Priority Data

Nov. 21, 2017  (CN) .......................... 201711168539.8
Feb. 9, 2018   (CN) .......................... 201810134652.2

(51) Int. Cl.
*H01J 37/28* (2006.01)
*H01J 37/244* (2006.01)
*H01J 37/145* (2006.01)

(52) U.S. Cl.
CPC ............ *H01J 37/28* (2013.01); *H01J 37/145* (2013.01); *H01J 37/244* (2013.01); *H01J 2237/2446* (2013.01)

(58) Field of Classification Search
CPC ........ H01J 37/28; H01J 37/244; H01J 37/265; H01J 2237/1035; H01J 2237/2448;
(Continued)

(56) References Cited

U.S. PATENT DOCUMENTS 4,675,524 A   6/1987 Frosien
4,785,176 A   11/1988 Frosien
(Continued)

FOREIGN PATENT DOCUMENTS

CN    1042029 A    5/1990
CN    1630926 A    6/2005
(Continued)

OTHER PUBLICATIONS

International search report in international application No. PCT/CN2018/085300, dated Aug. 21, 2018.
(Continued)

*Primary Examiner* — David A Vanore
(74) *Attorney, Agent, or Firm* — Syncoda LLC; Feng Ma

(57) ABSTRACT

A scanning electron microscope objective lens system is disclosed, which includes: a magnetic lens, a deflection device, a deflection control electrode, specimen to be observed, and a detection device; in which, The opening of the pole piece of the magnetic lens faces to the specimen; the deflection device is located in the magnetic lens, which includes at least one sub-deflector; the deflection control electrode is located between the detection device and the specimen, and the deflection control electrode is used to change the direction of the primary electron beam and the signal electrons generating from the specimen; the detection device comprises the first sub-detector for detecting the back-scattered electrons and the second sub-detector for detecting the second electrons. A specimen detection method is also disclosed.

16 Claims, 17 Drawing Sheets

(58) Field of Classification Search
CPC .... H01J 37/04; H01J 37/1474; H01J 37/1475; H01J 37/1477; H01J 2237/05; H01J 2237/053; H01J 2237/063; H01J 2237/082; H01J 2237/21; H01J 2237/2485; H01J 37/285; H01J 37/30
USPC ..... 250/396 ML, 310, 307, 396 R, 397, 311, 250/398, 491.1
See application file for complete search history.

(56) References Cited

U.S. PATENT DOCUMENTS

| | | | |
|---|---|---|---|
| 4,831,266 A * | 5/1989 | Frosien | H01J 37/10 250/396 ML |
| 4,926,054 A | 5/1990 | Frosien | |
| 4,963,823 A * | 10/1990 | Otto | H01J 37/04 324/754.22 |
| 5,146,090 A * | 9/1992 | Plies | H01J 37/12 250/311 |
| 5,780,859 A * | 7/1998 | Feuerbaum | H01J 37/145 250/396 ML |
| 6,107,633 A * | 8/2000 | Frosien | H01J 37/145 250/396 ML |
| 6,194,729 B1 * | 2/2001 | Weimer | H01J 37/04 250/396 ML |
| 6,392,231 B1 * | 5/2002 | Chen | H01J 37/141 250/310 |
| 6,407,387 B1 * | 6/2002 | Frosien | H01J 37/28 250/310 |
| 6,498,345 B1 | 12/2002 | Weimer | |
| 6,617,579 B2 | 9/2003 | Yonezawa | |
| 6,642,520 B2 | 11/2003 | Kimura | |
| 6,855,938 B2 | 2/2005 | Preikszas | |
| 7,233,008 B1 * | 6/2007 | Petrov | G03B 27/42 250/396 ML |
| 7,425,701 B2 | 9/2008 | Steigerwald | |
| 7,705,302 B2 | 4/2010 | Aoki | |
| 7,759,653 B2 | 7/2010 | Chen | |
| 7,928,405 B2 * | 4/2011 | Adamec | H01J 37/141 250/396 ML |
| 7,960,697 B2 | 6/2011 | Chen | |
| 8,319,192 B2 | 11/2012 | Ren | |
| 8,742,342 B2 * | 6/2014 | Okai | H01J 37/28 250/310 |
| 8,785,879 B1 * | 7/2014 | Frosien | H01J 37/28 250/396 ML |
| 9,000,370 B2 | 4/2015 | Ren et al. | |
| 9,029,766 B2 | 5/2015 | Morishita | |
| 9,354,188 B2 | 5/2016 | Albiez | |
| 9,362,086 B2 | 6/2016 | Tma et al. | |
| 9,490,100 B2 | 11/2016 | Sytar et al. | |
| 9,583,306 B2 * | 2/2017 | Li | H01J 37/28 |
| 9,601,303 B2 | 3/2017 | Frosien | |
| 9,620,331 B1 * | 4/2017 | Bhattiprolu | H01J 37/261 |
| 9,767,986 B2 | 9/2017 | Brown et al. | |
| 10,008,360 B2 * | 6/2018 | Li | H01J 37/1474 |
| 10,103,002 B1 * | 10/2018 | Gamm | H01J 37/222 |
| 10,658,152 B1 * | 5/2020 | Hendrich | H01J 37/10 |
| 2003/0209667 A1 * | 11/2003 | Petrov | H01J 37/1478 250/310 |
| 2004/0046125 A1 * | 3/2004 | Chen | H01J 37/141 250/396 ML |
| 2004/0056207 A1 * | 3/2004 | Petrov | H01J 37/1475 250/396 ML |
| 2004/0245465 A1 | 12/2004 | Steigerwald | |
| 2006/0049348 A1 * | 3/2006 | Petrov | G01N 23/2251 250/307 |
| 2006/0060780 A1 * | 3/2006 | Masnaghetti | H01J 37/28 250/310 |
| 2006/0163478 A1 * | 7/2006 | Jaksch | H01J 37/28 250/310 |
| 2008/0099674 A1 * | 5/2008 | Bihr | G03F 1/86 250/307 |
| 2008/0121810 A1 * | 5/2008 | Liu | H01J 37/145 250/396 ML |
| 2008/0230694 A1 * | 9/2008 | Frosien | H01J 37/12 250/307 |
| 2010/0038538 A1 * | 2/2010 | Drexel | H01J 37/145 250/311 |
| 2010/0297362 A1 * | 11/2010 | Budach | C23C 16/047 427/585 |
| 2012/0049064 A1 * | 3/2012 | Ren | H01J 37/145 250/310 |
| 2013/0214155 A1 * | 8/2013 | Winkler | H01J 37/28 250/307 |
| 2014/0077079 A1 | 3/2014 | Hoque et al. | |
| 2014/0175279 A1 * | 6/2014 | Agemura | H01J 37/28 250/310 |
| 2016/0064184 A1 | 3/2016 | Brown et al. | |
| 2016/0172150 A1 | 6/2016 | Li | |
| 2016/0217968 A1 | 7/2016 | Li et al. | |
| 2016/0365221 A1 * | 12/2016 | Preikszas | H01J 37/10 |
| 2017/0018394 A1 | 1/2017 | Sohda et al. | |
| 2017/0047192 A1 | 2/2017 | Frosien | |
| 2017/0236683 A1 * | 8/2017 | Hegele | H01J 37/141 250/307 |
| 2017/0271124 A1 | 9/2017 | Sasaki et al. | |
| 2017/0309443 A1 * | 10/2017 | Han | G06T 3/4038 |
| 2017/0329025 A1 | 11/2017 | Brown et al. | |
| 2018/0286632 A1 * | 10/2018 | Biberger | G01N 1/06 |
| 2020/0075287 A1 * | 3/2020 | Jen | G01N 23/2251 |
| 2020/0234914 A1 * | 7/2020 | Li | H01J 37/1475 |
| 2020/0333271 A1 * | 10/2020 | Hendrich | H01J 37/265 |

FOREIGN PATENT DOCUMENTS

| | | |
|---|---|---|
| CN | 101388317 A | 3/2009 |
| CN | 101390186 A | 3/2009 |
| CN | 101996839 A | 3/2011 |
| CN | 103839743 A | 6/2014 |
| CN | 104897700 A | 9/2015 |
| CN | 106575594 A | 4/2017 |
| CN | 106920723 A | 7/2017 |
| CN | 207425790 U | 5/2018 |
| CN | 108231511 A | 6/2018 |
| CN | 109300759 A | 2/2019 |
| EP | 1435640 A2 | 7/2004 |
| JP | 2000164167 A | 6/2000 |
| JP | 5004318 B2 | 8/2012 |
| JP | 2015170518 A | 9/2015 |

OTHER PUBLICATIONS

Written opinion of the international search authority in international application No. PCT/CN2018/085300, dated Aug. 21, 2018.
International search report in international application No. PCT/CN2018/075564, dated Aug. 23, 2018.
Written opinion of the international search authority in international application No. PCT/CN2018/075564, dated Aug. 23, 2018.
Supplementary European Search Report in the European application No. 19876263.5, dated May 7, 2021.

* cited by examiner

SCANNING ELECTRON MICROSCOPE OBJECTIVE LENS SYSTEM AND METHOD FOR SPECIMEN OBSERVATION

TECHNICAL FIELD

The present disclosure relates to the field of Scanning Electron Microscopes (SEMs), and in particular to a scanning electron microscope objective lens system and a specimen detection method.

BACKGROUND

Compared to optical microscopes, SEMs have a higher resolution. However, SEMs have a weakness in aspect of field of view (FOV), which is usually smaller than one hundred micrometers, and the imaging speed or throughput of SEMs is slower than that of optical microscopes. On the other hand, the high-throughput characteristic becomes an imperative requirement for SEMs with the research and industrial development. For example, in the semiconductor and panel display inspection field, not only the high resolution but also the high throughput (i.e., improved inspection speed) of the SEMs is needed to fulfill the mass industrialized production.

In the application of the SEMs, when detecting a non-conductive specimen, use of a high landing energy electron beam will damage the specimen and cause a charge effect which will affect detection of the specimen. As a result, a low landing energy SEM is produced to observe the specimen using a low landing energy electron beam.

Under the condition of the low landing energy electron beam, how to improve the resolution and FOV of the SEMs and achieve an efficient detection of signal electrons in the increased FOV become a problem to be solved urgently.

SUMMARY

In view of this, embodiments according to the disclosure provide a scanning electron microscope objective lens system and a method for specimen detection, to achieve high detection efficiency of signal electrons while maintaining high resolution and large FOV of the SEM.

An embodiment of the disclosure provides a scanning electron microscope objectives lens system, comprising: a magnetic lens, a deflection device, a deflection control electrode, a specimen to be observed and a detection device; wherein an opening of a pole piece of the magnetic lens faces to the specimen; the deflection device is arranged in the magnetic lens, which contains at least one sub-deflector; the deflection control electrode is located between the detection device and the specimen, and is arranged to change a direction of a primary electron beam impinging on the specimen and change a direction of signal electrons generated, at the specimen, due to the impinging; and the detection device comprises a first sub-detector for detecting back-scattered electrons among the signal electrons and a second sub-detector for detecting secondary electrons among the signal electrons.

In an implementation, the deflection control electrode includes: the deflection control electrode includes: a first central hole and a plurality of deflection control sub-electrodes; and the plurality of deflection control sub-electrodes are deployed around the first central hole.

In an implementation, the first sub-detector comprises a second central hole, and a diameter of the second central hole is smaller than that of the first central hole.

In an implementation, the first sub-detector includes at least one the first sub-detection component; each of the first sub-detection components is arranged to acquire a signal corresponding to signal electrons of a respective zone and send the signal to an external image processing device to image the signal electrons of the respective zone.

In an implementation, the diameter of the second central hole is of an order of millimeters.

In an implementation, the specimen to be observed is located on a specimen stage; a second voltage of the specimen stage is V2, and the first sub-detector, the deflection control electrode, and the specimen stage make up a retarding electrostatic lens field.

In an implementation, the system further includes a high voltage tube, and a central axis of the high voltage tube coincides with that of the magnetic lens.

In an implementation, the sub-deflectors are magnetic deflectors.

In an implementation, the second voltage of the specimen stage is V2, where V2 is no less than −30 kilovolts (kV) and no more than 5 kV; a voltage of the first sub-detector is 0 volt (V), the deflection control electrode is applied to a third voltage and a fourth voltage; the third voltage V3 is constant, where V3 is no less than V2 and no more than 0; and the fourth voltage V4 is an alternating voltage.

In an implementation, a voltage of the specimen to be observed is 0V, the deflection control electrode is applied to a third voltage and a fourth voltage; a voltage of the first sub-detector is V5, 5 kV≤V5≤30 kV; a third voltage V3 is constant, where V3 is no less than 0 and no more than V5; a fourth voltage V4 is an alternating voltage.

An embodiment of the disclosure provides a method for specimen detection applied to the scanning electron microscope objective lens system, wherein a first sub-detector for receiving back-scattered electrons, a deflection control electrode, and a specimen to be observed in the scanning electron microscope objective lens system form a retarding electrostatic lens field, the retarding electrostatic lens field overlaps with a magnetic field produced by a magnetic lens in the scanning electron microscope objective lens system at a zone near the specimen, to form a compound objective retarding immersion lens field; the method comprises: making a primary electron beam to pass through the compound objective retarding immersion lens field, deflecting, by a deflection device in the scanning electron microscope objective lens system and the deflection control electrode, the primary electron beam, wherein after the deflection, the primary electron beam impinge on the specimen to produce signal electrons; controlling a voltage of the deflection control electrode, such that the signal electrons are received by the first sub-detector and a second sub-detector in the scanning electron microscope system.

In an implementation, the method further comprises controlling the voltage of the deflection device and the deflection control electrode, to couple a deflection field formed by the deflection device and the deflection control electrode to the compound objective retarding immersion lens field, and achieve shifting objective retarding receiving lens field scanning of the specimen or swing objective retarding receiving lens field scanning of the specimen.

In an implementation, in case the deflection device includes a plurality of sub-deflectors, wherein controlling the voltage of the deflection device and the deflection control electrode, to couple the deflection field to the compound objective retarding immersion lens field includes: controlling the voltage of the sub-deflector nearest to the specimen among the plurality of sub-deflectors, and controlling the voltage of the deflection control electrode, to couple the deflection field produced by the sub-deflector nearest to the specimen and the deflection control electrode with the compound objective retarding immersion lens field.

In an implementation, the sub-detector includes at least one sub-detector component, the method further comprises: acquiring, by each of the first sub-detection components, a signal corresponding to signal electrons of a respective zone, and sending the signal to an external image processing device to image the signal electrons of the respective zone.

In an implementation, the specimen is located at the specimen stage; a second voltage of the specimen stage is V2, the first sub-detector, the deflection control electrode, and the specimen stage make up a retarding electrostatic lens field.

In an implementation, the system further includes a high voltage tube, a central axis of the high voltage tube coincides with that of the magnetic lens.

In an implementation, the deflection control electrode is applied to a third voltage and a fourth voltage, and the fourth voltage is an alternating voltage; a voltage of the specimen stage is set to be V2, where V2 is no less than −30 kilovolts (kV) and no more than 5 kV; a voltage of the first sub-detector is set to be 0 volt (V), and the third voltage V3 is set to be a constant, where V3 is no less than V2 and no more than 0;

In an implementation, the deflection control electrode is applied to a third voltage and a fourth voltage, and the fourth voltage is an alternating voltage; a voltage V2 of the specimen stage is set to be 0; a voltage of the first sub-detector is set to be V5, where V5 is no less than 5 kV and no more than 30 kV, and the third voltage V3 is set to a constant, where V3 is no less than 0 and no more than V5.

In the embodiment of the present disclosure, by controlling the voltages of the first sub-detector, the deflection control electrode, and the specimen to be observed, a retarding electrostatic lens field is constructed and coupled to the magnetic immersion lens field to form a compound objective retarding receiving immersion lens field, in which the primary electron beam will be decelerated and impinge on the specimen with a low landing energy, and therefore the charge effect of the non-conductive specimen will be weakened. By controlling the voltages of the deflection device and the deflection control electrode, the produced the deflection field is coupled with the compound retarding immersion field, and the moving objective retarding receiving immersion lens (MORRIL) or the swing objective retarding receiving immersion lens (SORRIL) is achieved, which reduces the off-axis and deflection aberration and improves the resolution. In addition, the signal electrons (BSEs and SEs) are accelerated and controlled by the compound retarding receiving immersion lens field, and the signal electrons collection efficiency is improved.

DETAILED DESCRIPTION

The details are described as follows with reference to the figures and several embodiments. It should be understood that the specific embodiments described herein are merely used to explain the disclosure, and are not intended to limit the disclosure.

Before the disclosure is further described in detail, the terms involved in the embodiments of the disclosure are described. The terms involved in the embodiments of the disclosure are applicable to the following explanations.

1) Space charge effect. This is a phenomenon that in the electronic optical system the Coulomb forces between the electrons make the electron beam "expansion" and lead to increasing of the aberration of the electron beam imaging system. Especially when the electron beam forms a crossover beam spot, the density of the electron beam is very high in the crossover beam spot, and the distance between the electrons is small. Due to that the Coulomb's force is inversely proportional to the square of the distance between the electrons, a larger Coulomb force will cause the beam spot of the electron beam to expand.

2) The primary electron beam. The electron beam generated by the electron source is referred to as the primary electron beam before reaching the specimen.

3) Signal electrons. The electrons emitted from the specimen when the primary electron beam impinges on the specimen are referred to as the signal electrons, including: secondary electrons (SEs) and backscattered electrons (BSEs).

4) Optical axis. It is the central axis of the electron beam.

5) Large field (or large field scanning). The area of the specimen that is covered by the primary electron beam scanning is called the scanning field or field of view (FOV); therefore, large field usually refers to a scanning field whose area is large, in terms of the scanning electron microscope, when the side length of the field area reaches several hundreds of micrometers, the field can be called a large field.

Embodiment 1

Figure 1:
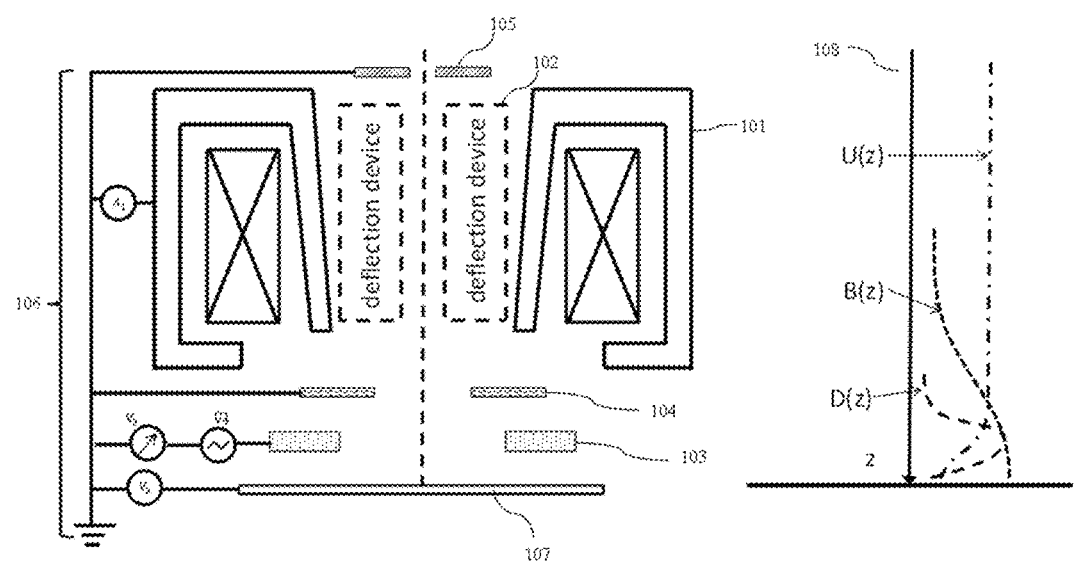
FIG. 1 is a diagram of a scanning electron microscope objective lens system according to Embodiment 1 of the disclosure.

The embodiment 1 of the disclosure provides a scanning electron microscope objective lens system. As shown in FIG. 1, the scanning electron microscope objective lens system includes: a magnetic lens 101, a deflection device 102, a deflection control electrode 103, a specimen to be observed 107, and a detection device including a first sub-detector 104 and a second sub-detector 105.

In the embodiment 1 of the present disclosure, the magnetic lens 101 is a current-driven immersion magnetic lens, the opening of the annular polepiece faces to the specimen 107; the position of the optical axis of the magnetic lens 101 with the maximum magnetic field intensity is near to the specimen, so as to form a magnetic immersion lens.

In the embodiment 1 of the present disclosure, the deflection device 102 is located in the magnetic lens 101; the deflection device 102 includes at least one sub-deflector.

When the deflection device 102 includes multiple sub-deflectors, these sub-deflectors can be made up of pure electrostatic deflectors, or pure magnetic deflectors, or a combination of electrostatic and magnetic deflectors.

When the multiple sub-deflectors of the deflection device 102 are a combination of electrostatic and magnetic deflectors, there is no limit to the number of the two kinds of deflectors. For example, when the deflection device 102 includes four sub-deflectors, in an embodiment, there is one electrostatic deflector and three magnetic deflectors; in another embodiment, there are two electrostatic deflectors and two magnetic deflectors; in yet another embodiment, there are three electrostatic deflectors and one magnetic deflector; in yet another embodiment, there are four magnetic deflectors and no electrostatic deflector; and in yet another embodiment, there are four electrostatic deflectors and no magnetic deflector.

In the embodiment 1 of the present disclosure, the deflector device 102 is cylindrical, when the deflection device 102 includes multiple sub-deflectors, the sub-deflectors are deployed in the magnetic lens from top to bottom along the axis of the magnetic lens 101. When the multiple sub-deflectors are a combination of electrostatic and magnetic deflectors, there is no limit to the position of anyone of the deflectors. For example, when the deflection device 102 includes four sub-deflectors, in an embodiment, the types of the sub-deflectors from top to bottom along the axis of magnetic lens are respectively: electrostatic deflector, electrostatic deflector, magnetic deflector, and magnetic deflector; in another embodiment the types of the sub-deflectors from top to bottom along the axis of magnetic lens are respectively: electrostatic deflector, magnetic deflector, electrostatic deflector, and magnetic deflector; in yet another embodiment, the types of the sub-deflectors from top to bottom along the axis of magnetic lens are respectively: magnetic deflector, magnetic deflector, electrostatic deflector, and electrostatic deflector. Of course, there are some other combinations for the types and positon of the multiple deflectors, which we will not describe in detail here.

In the embodiment 1 of the present disclosure, the deflection-control electrode 103 is made of nonmagnetic and electrically conductive material, and it is located under the magnetic lens 101, and above the specimen 107.

In the embodiment 1 of the present disclosure, the deflection-control electrode 103 includes: a first central hole and multiple deflection control sub-electrodes; the multiple deflection control sub-electrodes are centered at the first central hole and deployed around the first central hole. Therefore, the deflection-control electrode is in the form of several petals.

Figure 2A:
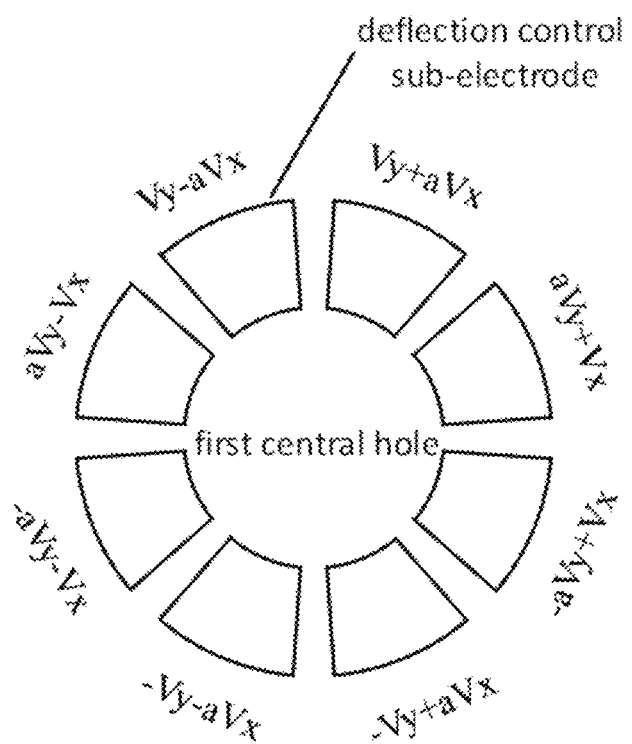
FIG. 2a is a diagram of the structure of a deflection-control electrode according to Embodiment 1 of the disclosure.

For example, the deflection-control electrode is in the form of eight petals, a diagram of which is shown in FIG. 2a, the voltages applied to eight deflection control sub-electrodes are respectively: $V_y+aV_x$, $aV_y+V_x$, $-aV_y+V_x$, $-V_y+aV_x$, $-V_y-aV_x$, $-aV_y-V_x$, $aV_y-V_x$, $V_y-aV_x$; wherein, a is a voltage ratio factor, $V_y$ is the voltage component in the y direction, $V_x$ is the voltage component in the x direction.

Figure 2B:
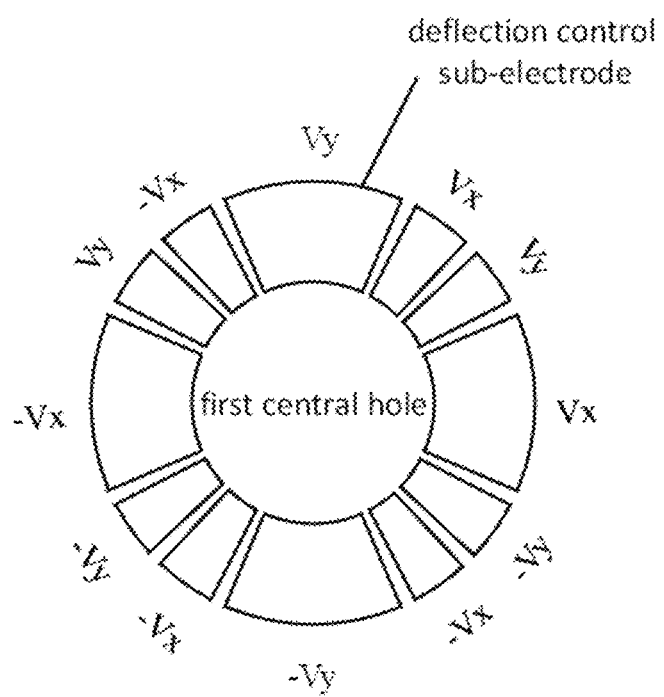
FIG. 2b is a diagram of the structure of another deflection-control electrode according to Embodiment 1 of the disclosure.

For example, the deflection control electrode is in the form of twelve petals, a diagram of which is shown in FIG. 2b, the voltages applied to twelve deflection-control sub-electrodes are respectively: $V_y$, $V_x$, $V_y$, $V_x$, $-V_y$, $-V_x$, $-V_y$, $-V_x$, $-V_y$, $-V_x$, $V_y$, $-V_x$. Wherein, $V_y$ is the voltage component in the y direction, Vx is the voltage component in the x direction. In the embodiment 1 of the present disclosure, a constant voltage V3 is applied to the deflection control electrode 103 by the power supply system. Meanwhile, an alternating voltage V4 is further applied to the deflection control electrode 103 by the power supply system, so that the deflection control electrode 103 works as a sub-deflector to deflect the primary beam impinging on the specimen and the signal electrons generated at the specimen due to the impinging.

In the embodiment 1 of the present disclosure, the first sub-detector 104 can be a backscattered electrons detector, the second sub-detector 105 can be a central detector. Here, the first sub-detector 104 and the second sub-detector 105 can be semiconductor detectors, avalanche detectors, or detectors made up of scintillator and optical guide tube, and the detectors are in the shape of circular disk with a central hole.

In the embodiment 1 of the present disclosure, the first sub-detector 104 has a second central hole, the diameter of the second central hole is smaller than that of the first central hole in the deflection-control electrode 103. In a preferred embodiment, the diameter of the second central hole in the first detector 104 is of an order of millimeters, as an example the diameter of the second central hole is less than 5 millimeters.

In the embodiment 1 of the present disclosure, the first detector device 104 includes at least one sub-detection component, each of the first sub-detection components is arranged to acquire a signal corresponding to signal electrons of a respective zone and send the signal to an external image processing device to image the signal electrons of the respective zone. The first sub-detector 104 is made of semiconductor material, when the first sub-detector 104 includes multiple first sub-detection components, these components are centered at the second central hole and deployed around the second central hole; and the multiple components are electrically insulated from each other. Each of the first sub-detection components is arranged to receive the signal electrons of a respective zone. Based on the structure of the first sub-detector 104, the detection area of the first sub-detector 104 is divided into multiple sub-detection zones according to the multiple sub-detection components.

Figure 3A:
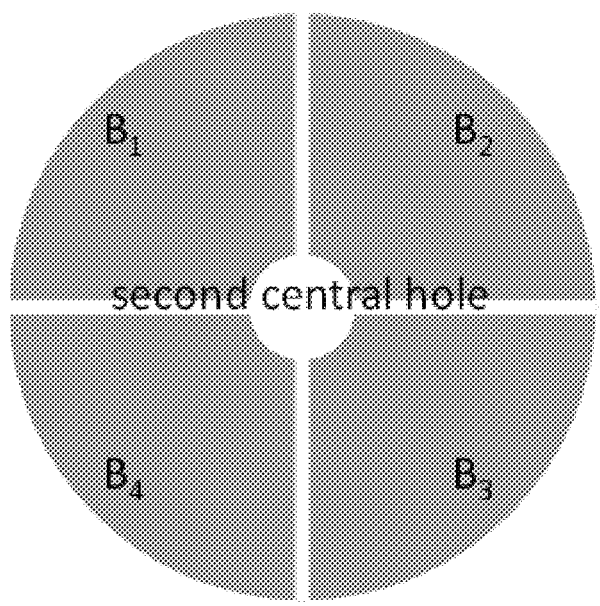
FIG. 3a is a diagram of the structure of a sub-detector and a detection area according to Embodiment 1 of the disclosure.

In an embodiment, a diagram of the structure and detection zone of the first detector 104 is shown in FIG. 3a, the detection zone of the first sub-detector 104 is divided into four fan-shaped sub-detection zones B1, B2, B3, and B4 centered at the second center hole. And the electron signals received by four detector zones are denoted as S1, S2, S3, and S4 respectively, and represent backscattered electron signals generated from four different orientations; and the above four signals are linked to four independent image processing devices or channels respectively, to generate four independent images; or the above four signals can be subjected to arithmetic operations to form an integrated signal, which is then output to an signal processing device to generate an image, the arithmetic operations include but not limit to addition, subtraction and so on.

Figure 3B:
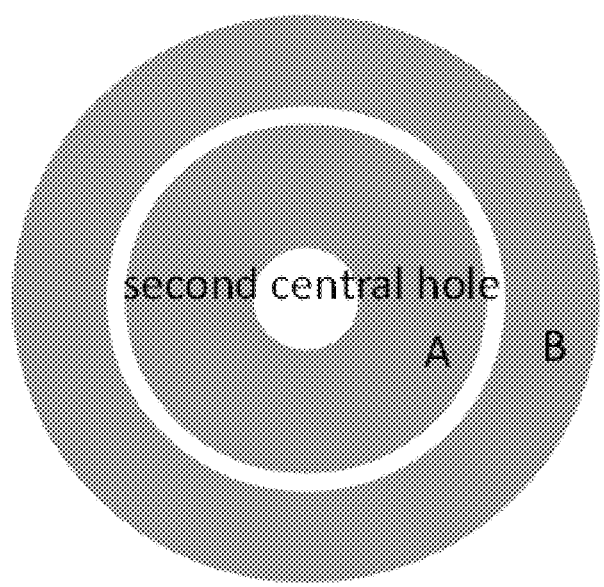
FIG. 3b is a diagram of the structure of another sub-detector and a detection area according to Embodiment 1 of the disclosure.

In another embodiment, a diagram of another structure and detection zone of the first detector 104 is shown in FIG. 3b, the detection zone of the first sub-detector 104 is divided into two annular sub-detection zones A and B, and the electron signals received by two detector zones are respectively S1 and S2, and represent backscattered electron signal with different emission angles.

Figure 3C:
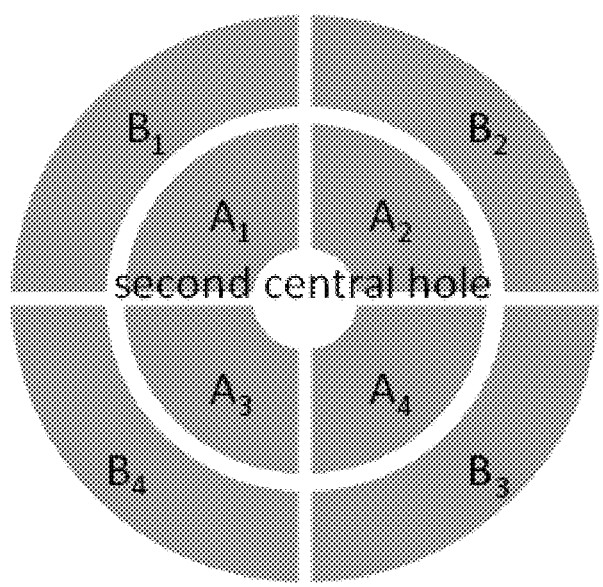
FIG. 3c is a diagram of the structure of another sub-detector and a detection area according to Embodiment 1 of the disclosure

In another embodiment, a diagram of another structure and detection zone of the first detector 104 is shown in FIG. 3c, the detection zone of the first sub-detector 104 is divided into both annular sub-detection zones and fan-shaped sub-detection zones around the second central hole; it can be understood that each of the two annular sub-detection zones in FIG. 3b are further divided into four fan-shaped zones, and totally eight sub-detection zones A1, A2, A3, A4, B1, B2, B3, and B4. And the electron signals received by eight sub-detection zones are respectively S1, S2, S3, S4, S5, S6, S7, and S8; and eight sub-detection zones represent backscattered electron signals with different emission angle and different orientations. And the above eight signals are linked to eight independent image processing devices or channels, to generate eight independent images; or the above eight signals can also be merged into one image after signal processing; and the signal processing includes but not limited to addition, subtraction and so on.

In the embodiment 1 of the present disclosure, a voltage is applied to the magnetic lens 101 by a power supply system, i.e., the power supply system powers the exciting coil of the magnetic lens 101, so that the magnetic lens 101 generates a stable magnetic field. The first sub-detector 104, the deflection-control electrode 103 and the specimen 107 are supplied voltages by the power supply system, the specimen 107 is located on a specimen stage, and the specimen 107 is supplied a voltage via the specimen stage by the power supply system.

In an embodiment of the present disclosure, the voltage of the first detector 104 is 0V, the range of the voltage V2 applied to the specimen 107 is where V2 is no less than −30 kilovolts (kV) and no more than 5 kV; wherein, the voltage of the deflection control electrode 103 includes a constant voltage V3 and a variable voltage V4, and V2≤V3≤0.

By controlling the electric potentials of the first detector 104, the deflection-control electrode 103 and the specimen 107, the first detector 104, the deflection-control electrode 103 and the specimen 107 together form a retarding electrostatic lens field, the electric potential distribution of the retarding electrostatic lens field on the optical axis is shown by 108 U(z) in FIG. 1; the magnetic flux density B(z) of the magnetic lens 101 is shown by 108 in FIG. 1, the maximum value of B(z) is found near the specimen 107. The deflection control electrode 106 generates a scanning field under control of an alternating voltage V4, which is shown by D(z) 108 in FIG. 1.

The retarding electrostatic lens field and the objective immersion lens field generated by the magnetic lens 101 together make up a compound retarding receiving immersion lens field; the compound retarding receiving immersion lens field mainly includes three functions; firstly, focusing the primary electron beam impinging on the specimen 107; secondly, decelerating the primary electron beam so as to impinge on the specimen with a low landing energy to reduce the charge effect on the non-conductive specimen; thirdly, accelerating the signal electrons (backscattered electrons and secondary electrons) to improve the efficiencies of the first sub-detector 104 and the second sub-detector 105 on collecting the signal electrons.

The compound retarding receiving immersion lens field is coupled with the scanning field generated by the deflection device 102 and the deflection control electrode 103, to achieve a swing objective retarding receiving immersion lens (SORRIL) scanning method or a moving objective retarding receiving immersion lens (MORRIL) scanning method. With the above two scanning methods, both the off-axis aberration and the deflection aberration are reduced, and therefore high resolution imaging of an order of hundreds of micrometers can be achieved.

Embodiment 2

Figure 4:
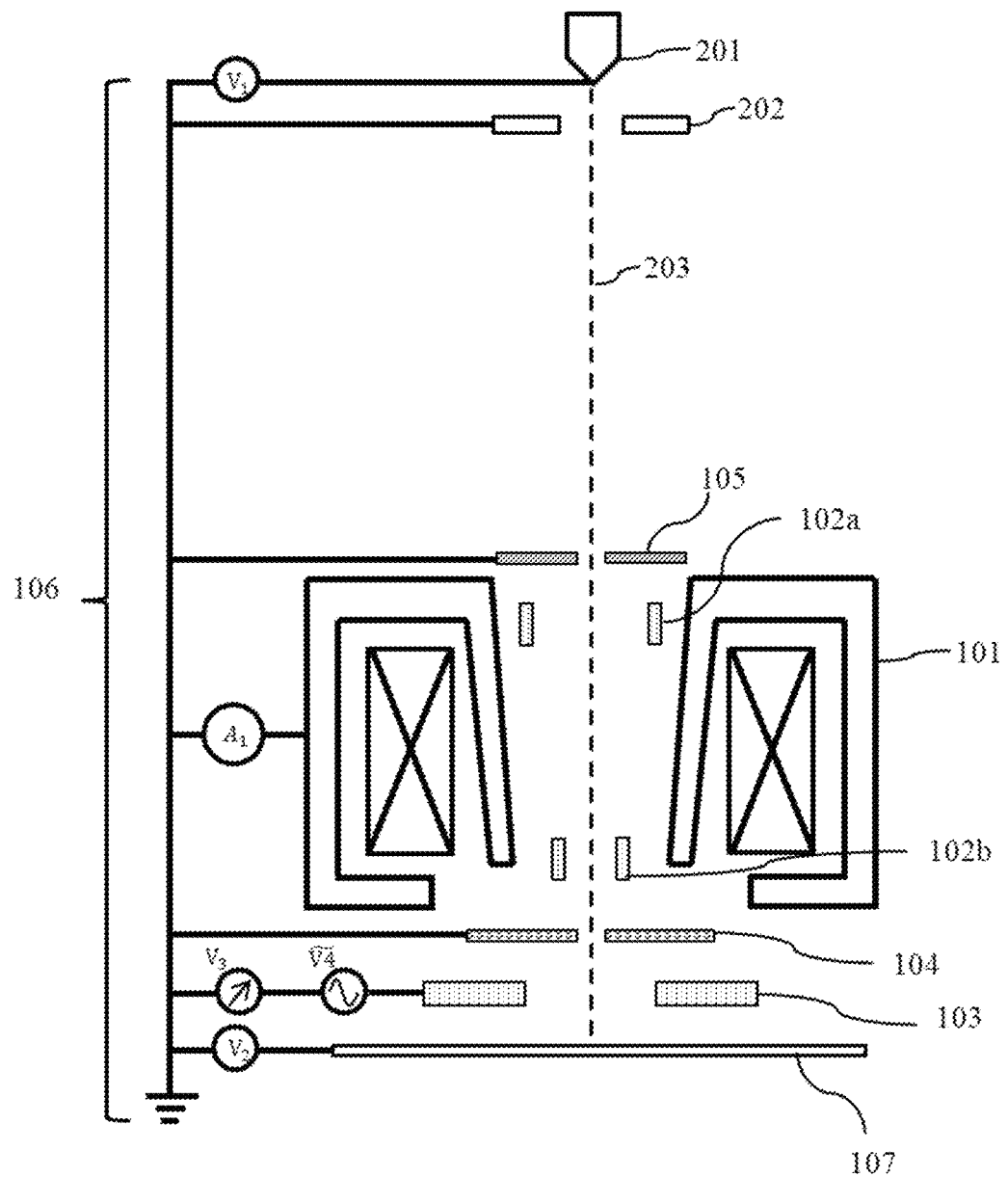
FIG. 4 is a diagram of scanning electron microscope lens system according to Embodiment 2 of the disclosure.

The embodiment 2 of the disclosure provides another scanning electron microscope objective lens system, which is similar to that in embodiment 1. The main differences are shown in FIG. 4, compared to the lens system described in embodiment 1, the lens system in this embodiment further includes an electron source 201 and an anode 202; the electron source 201 is a thermionic emission electron source (e.g., gun) or a field emission electron source (e.g., gun); the electron source 201 emits a primary electron beam, the primary electron beam moves down along the optical axis 203, and then goes through the scanning electron microscope objective lens system disclosed in this embodiment, and is finally focused to the surface of the specimen 107 for imaging.

In embodiment 2 of the disclosure, the deflection device 102 includes: sub-deflector 102a and sub-deflector 102d.

In embodiment 2 of the present disclosure, power supply system 106 is used to power the scanning electron microscope objective lens system. The voltage of the electron source is represented by V1, the range of V1 is: −30 kV≤V1≤−5 kV; the anode 202, the second sub-detector 105 and the first detector 104 are grounded, i.e., their voltages are zero; the range of the voltage V2 applied to the specimen 107 is where V2 is no less than −30 kilovolts (kV) and no more than 5 kV; the voltage of the deflection control electrode 103 includes a constant voltage V3 and a variable voltage V4, and V2≤V3≤0.

Embodiment 3

Figure 5:
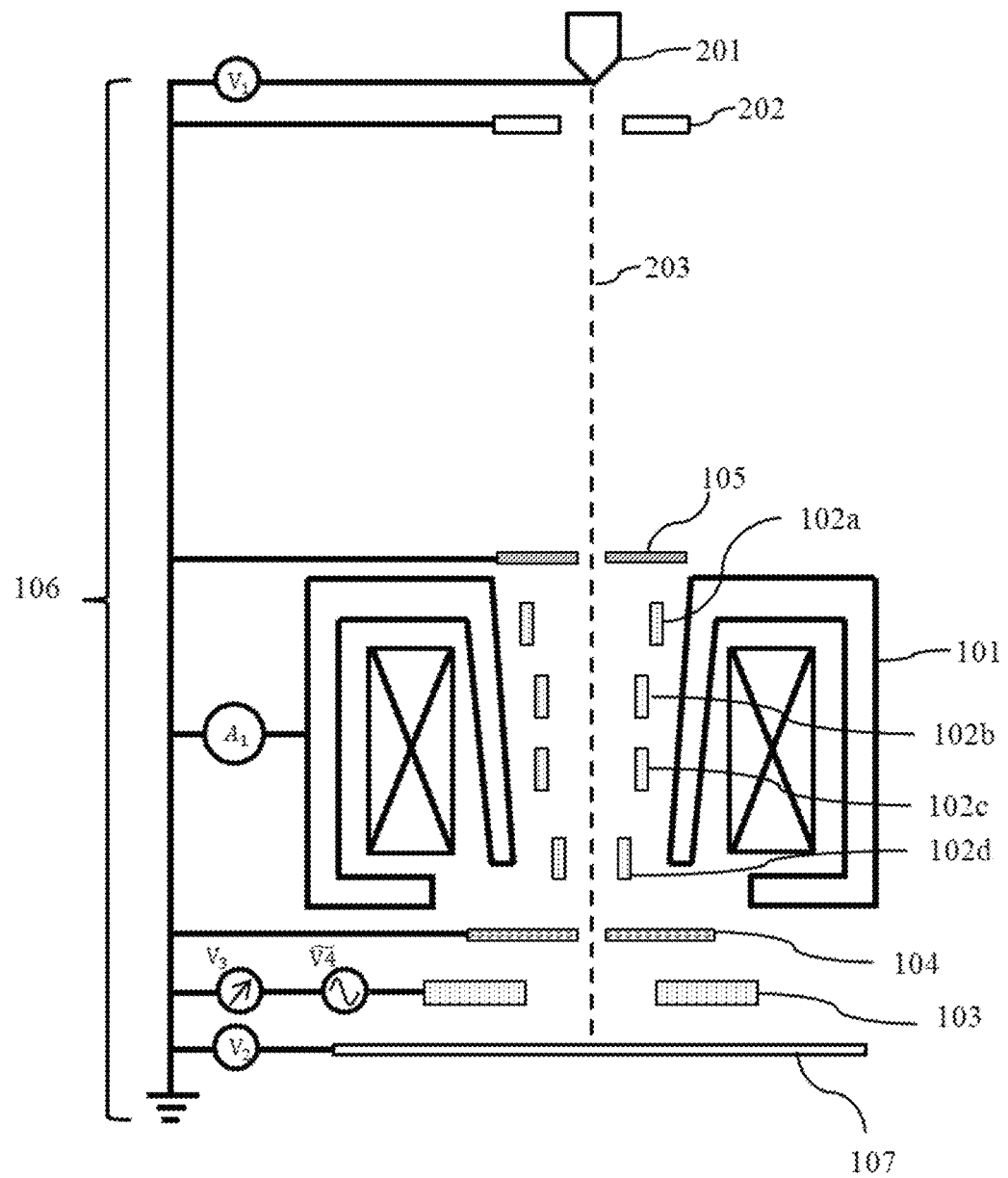
FIG. 5 is a diagram of scanning electron microscope lens system according to Embodiment 3 of the disclosure.

The embodiment 3 of the disclosure provides another scanning electron microscope objective lens system, which is similar to that in embodiment 2. The main differences shown in FIG. 5, compared to the lens system described in embodiment 2 are: the deflection device 102 includes from the top down along the optical axis 203: sub-deflector 102a, sub-deflector 102b, sub-deflector 102c, sub-deflector 102d.

Embodiment 4

Figure 6:
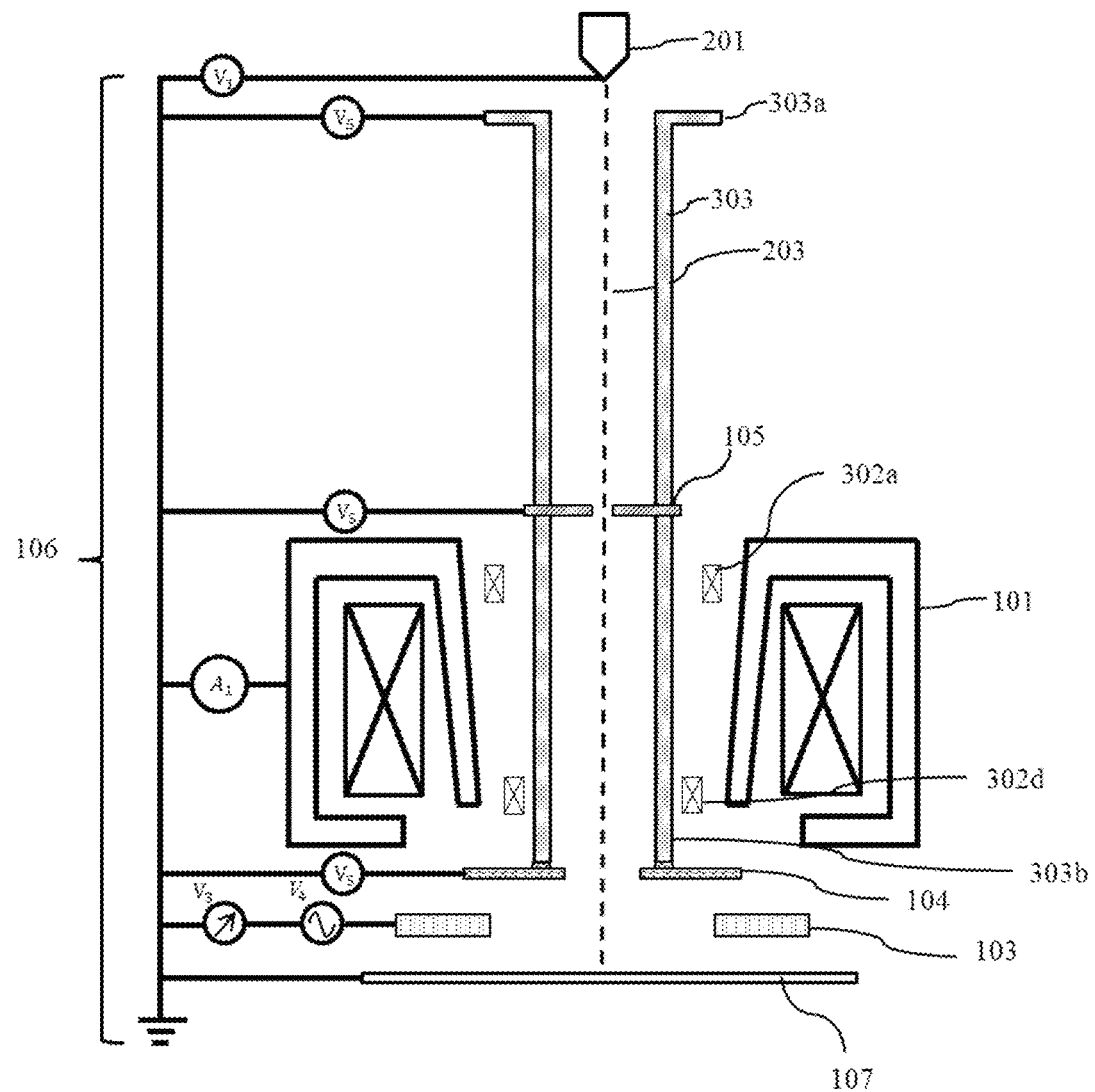
FIG. 6 is a diagram of scanning electron microscope lens system according to Embodiment 4 of the disclosure.

The embodiment 4 of the disclosure provides another scanning electron microscope objective lens system, which is similar to that in embodiment 2. The main differences are shown in FIG. 6, compared to the lens system described in embodiment 2. As shown in FIG. 6, the system further includes: a high voltage tube 303, one part of the high voltage tube is an anode 303a, a bottom end 303b of the high voltage tube 303 is insulated from the first sub-detector 104.

In this embodiment of the disclosure, the deflection device includes: a sub-deflector 302a, and a sub-deflector 302d; and both the sub-deflector 302a and the sub-deflector 302d are magnetic deflectors.

In this embodiment of the disclosure, the scanning electron microscope objective lens system is powered by a power supply system 106. The voltage of the electron source 201 is represented by V1, the range of V1 is: $-15\ kV \leq V1 \leq 0\ kV$; the voltages of the anode 302a, the second sub-detector 105 and the first sub-detector 104 are all represented by V5, and the range of V5 is: $5\ kV \leq V5 \leq 30\ kV$; the specimen to be observed is grounded, that is the voltage is zero; the voltage of the deflection control electrode includes a constant voltage V3 and a variable voltage V4, $0 \leq V3 \leq V5$.

Embodiment 5

Figure 7:
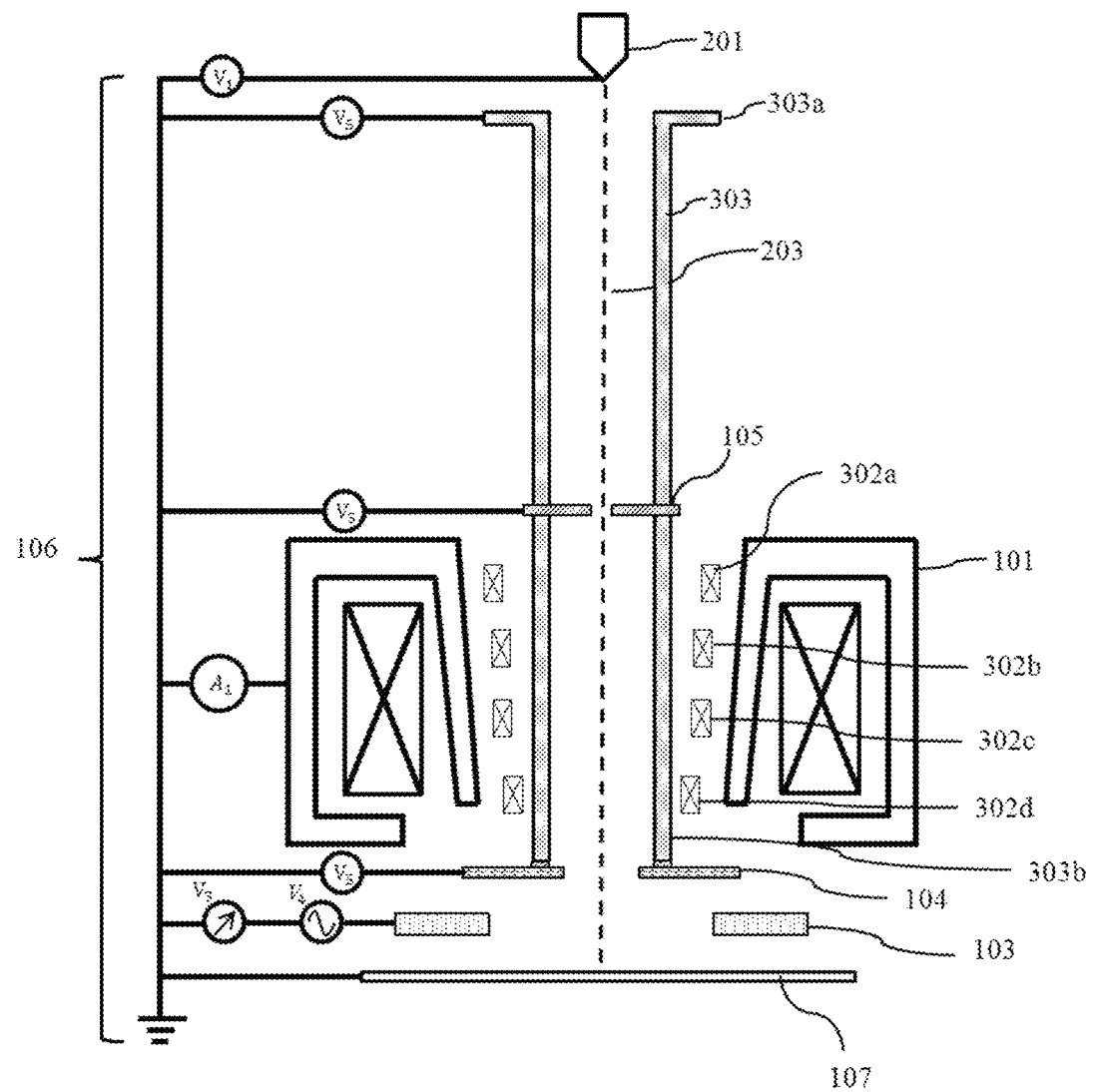
FIG. 7 is a diagram of scanning electron microscope lens system according to Embodiment 5 of the disclosure.

The embodiment 5 of the disclosure provides another scanning electron microscope objective lens system, which is similar to that in embodiment 4. The main differences shown in FIG. 7, compared to the lens system described in embodiment 4 are: from the top down along the optical axis 203, the deflection device 102 includes: sub-deflector 302a, sub-deflector 302b, sub-deflector 302c, sub-deflector 302d, and all of which are magnetic deflectors.

Embodiment 6

Figure 8:
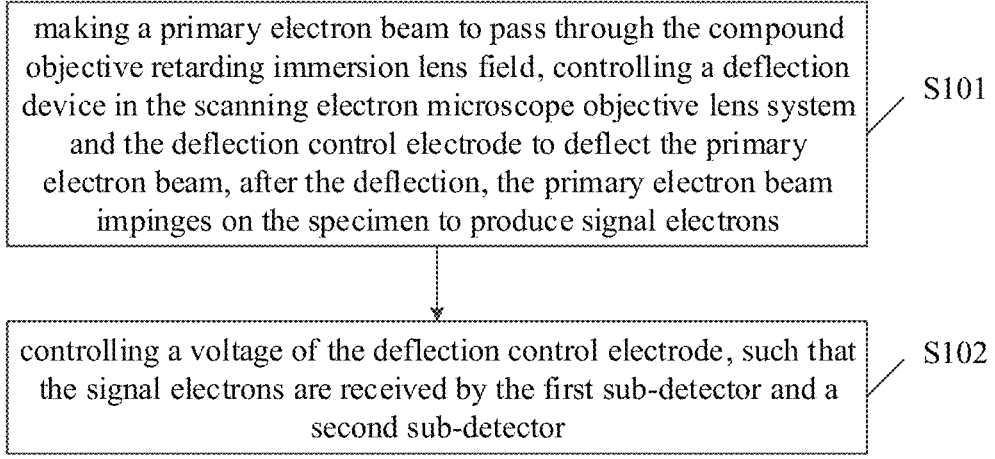
FIG. 8 is a flowchart of a method for specimen detection according to at least one embodiment of the disclosure.

Based on the scanning electron microscope objective lens system described in embodiment 1 to embodiment 5, embodiment 6 of the disclosure provides a specimen detection method, the method shown in FIG. 8 includes steps as follows.

Step S101, the primary electron beam goes through the compound retarding receiving immersion lens field, and is deflected by the deflection device and the deflection control electrode, and finally impinges on the specimen surface to generate the signal electrons.

In an embodiment of the disclosure, in the scanning electron microscope objective lens system, the first sub-detector, the deflection-control electrode and the specimen together generate an electrostatic retarding lens field, this electrostatic retarding lens field overlaps with the magnetic lens field near the specimen to form a compound retarding receiving immersion lens field 405.

Figure 9A:
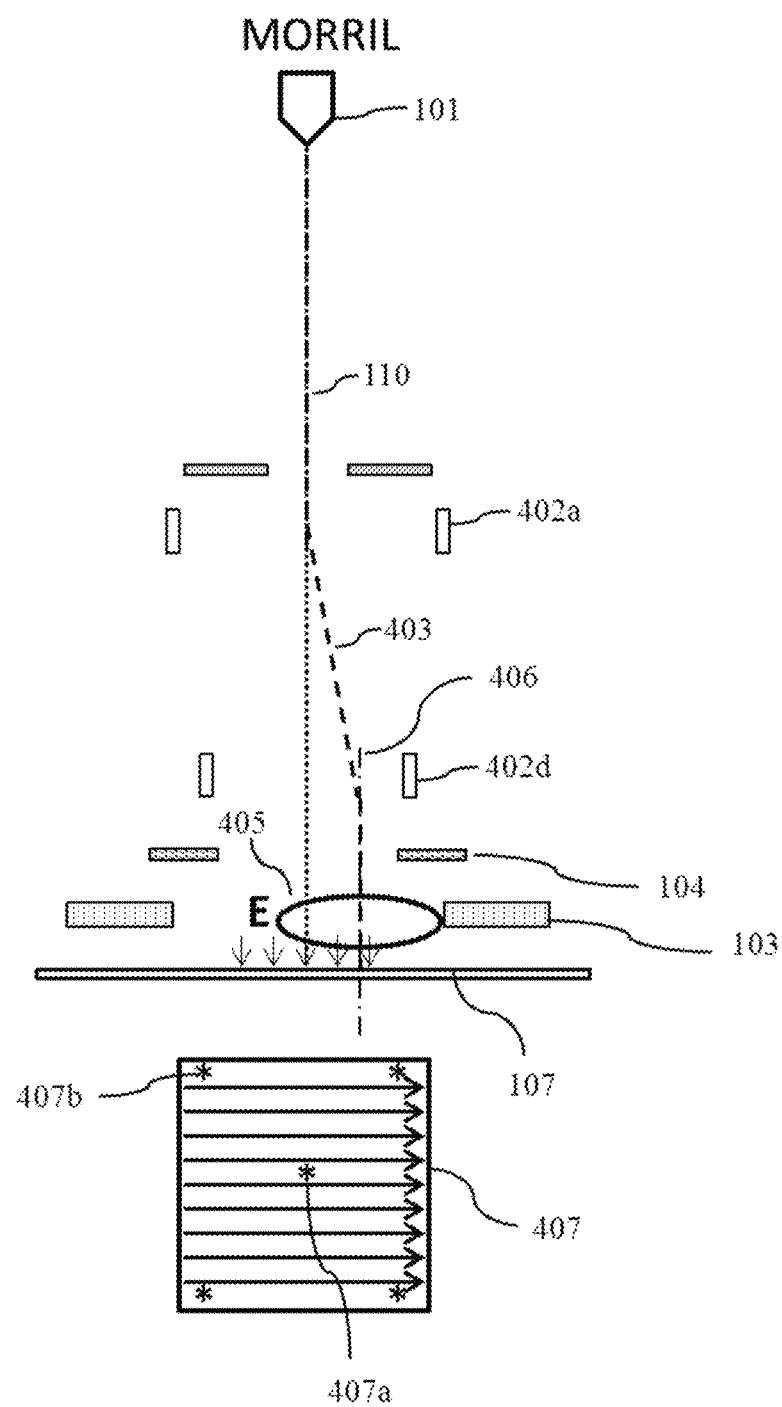
FIG. 9a is a diagram of MORRIL scanning according to an embodiment of the disclosure.
Figure 9B:
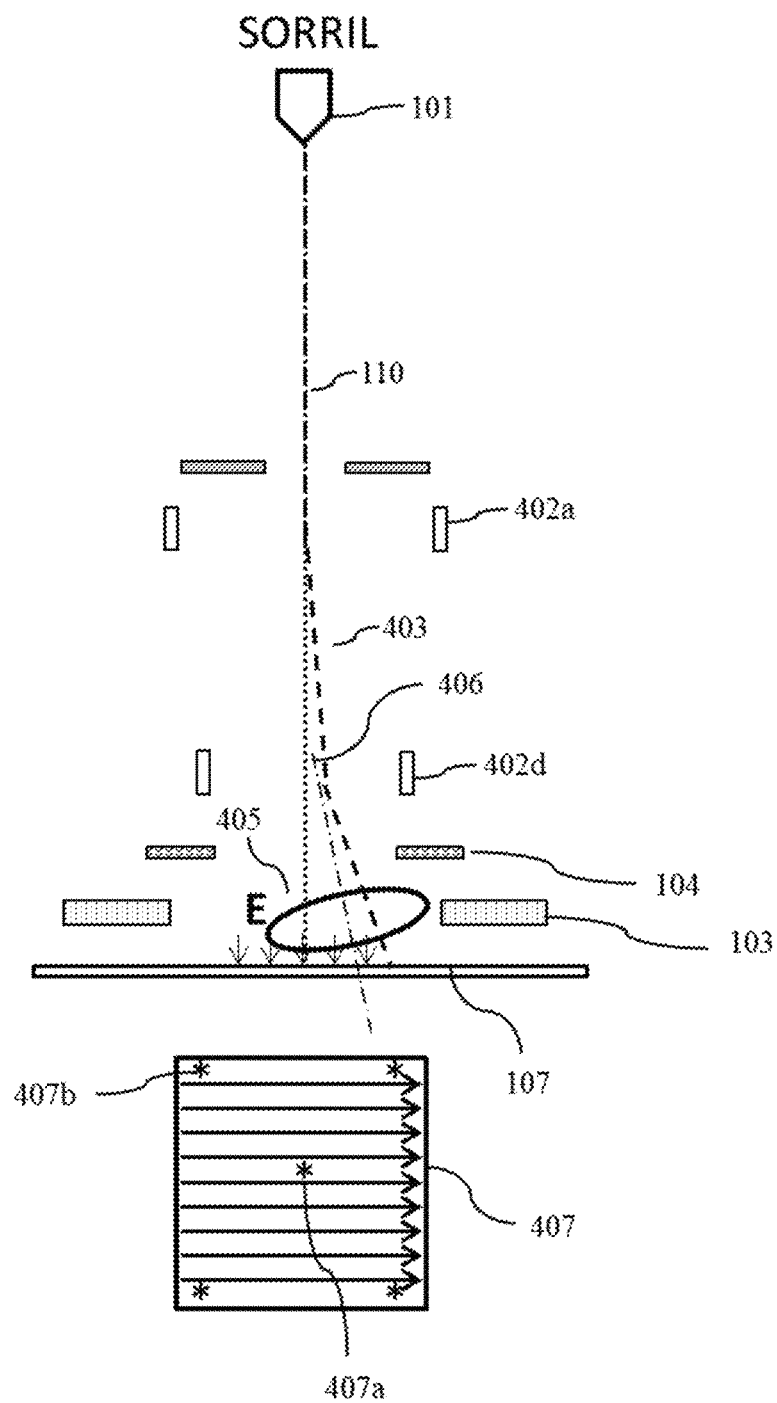
FIG. 9b is a diagram of SORRIL scanning according to an embodiment of the disclosure.

For example, the deflection device includes 402a and 402d, as shown in FIG. 9a and FIG. 9b the primary electron beam emitted from the electron source 101 is first deflected by the sub-deflector 402a to move far away from the optical axis 110, which is shown by 403 in FIG. 9a and FIG. 9b; and then is deflected by 402d.

In an embodiment of the disclosure shown in FIG. 9a, the deflection-control electrode 103 is supplied a scanning voltage by the power supply system to generate a scanning electric field, and the scanning electric field and a scanning electric field produced by the sub-deflector 402d are coupled with the compound retarding receiving immersion lens field 405, as a consequence the optical axis 406 of the compound retarding receiving immersion lens field is shifted laterally and no longer coincides with the optical axis 110 of the system, and therefore a Moving Objective Retarding Receiving Immersion Lens (MORRIL) is formed. Since the optical axis 406 of the compound retarding receiving lens is shifted laterally, the off-axis aberration and deflection aberration are reduced when performing large scanning field imaging, and a high resolution can be achieved at the edge and center of the large field. As shown by 407 in FIG. 9a, the primary electron beam is deflected by sub-deflector 402a, sub-deflector 402d and deflection control electrode 103 to perform a large FOV raster scan, where 407a is the center of the scanning field, and 407b is a random point at the edge of the scanning field.

In another embodiment of the disclosure shown in FIG. 9b, the deflection-control electrode 103 is supplied a scanning voltage by the power supply system to generate a scanning electric field, and the scanning electric field and a scanning electric field produced by the sub-deflector 402d are coupled with the compound retarding receiving immersion lens field 405. With a coupling method different to that in FIG. 9a, the optical axis 406 of the compound retarding receiving immersion lens field swings and is no longer parallel with the optical axis 110 of the system, and therefore a Swing Objective Retarding Receiving Immersion Lens (SORRIL) is formed. Since the optical axis 406 of the compound retarding receiving lens swings, the off-axis aberration and deflection aberration are reduced when performing large field imaging and a high resolution can be achieved at the edge and center of the large field. As shown by 407 in FIG. 9b, the primary electron beam is deflected by sub-deflector 402a, sub-deflector 402d and deflection control electrode 103 to perform a large FOV raster scan, where 407a is the center of the scanning field, and 407b is a random point at the edge of the scanning field.

Figure 10A:
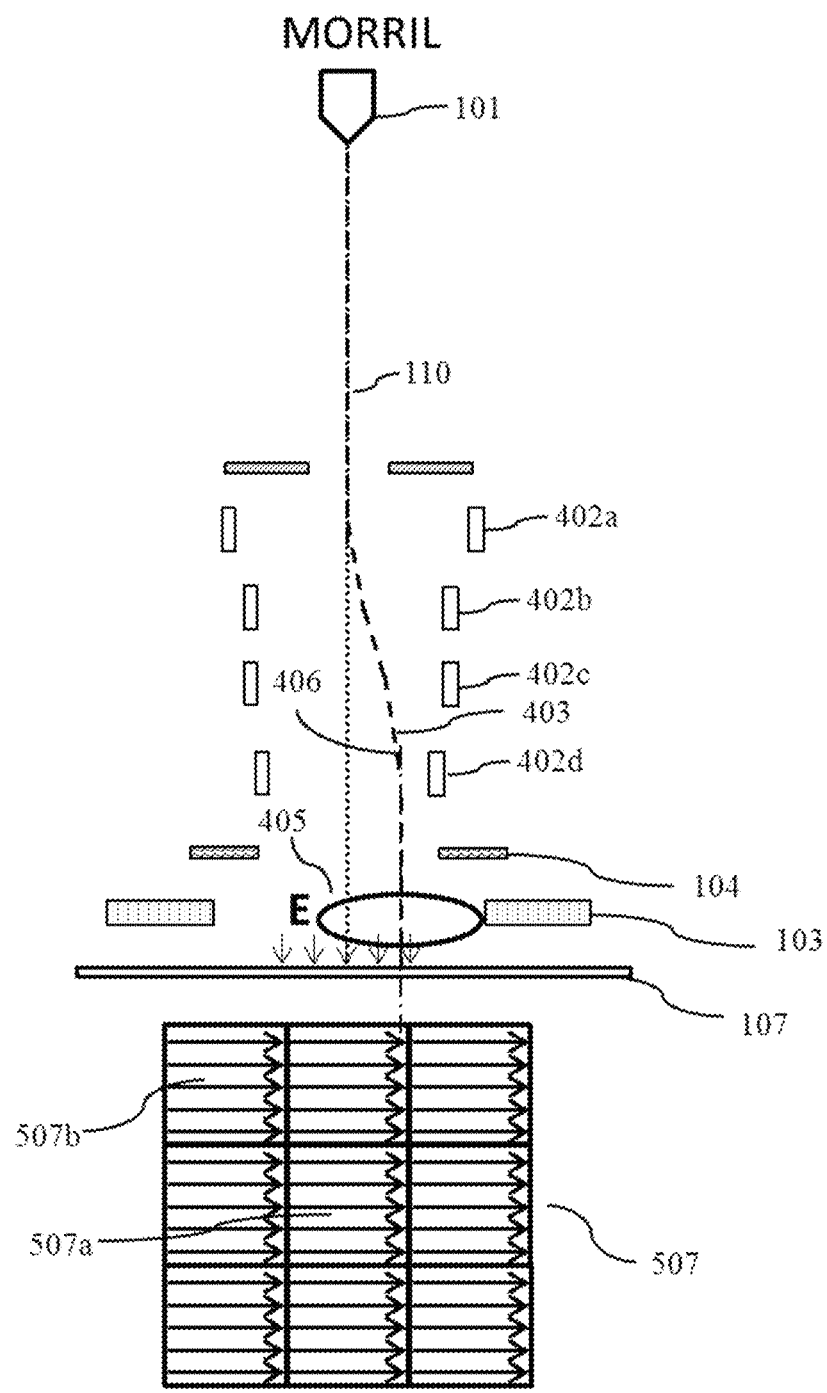
FIG. 10a is a diagram of MORRIL scanning according to an embodiment of the disclosure.
Figure 10B:
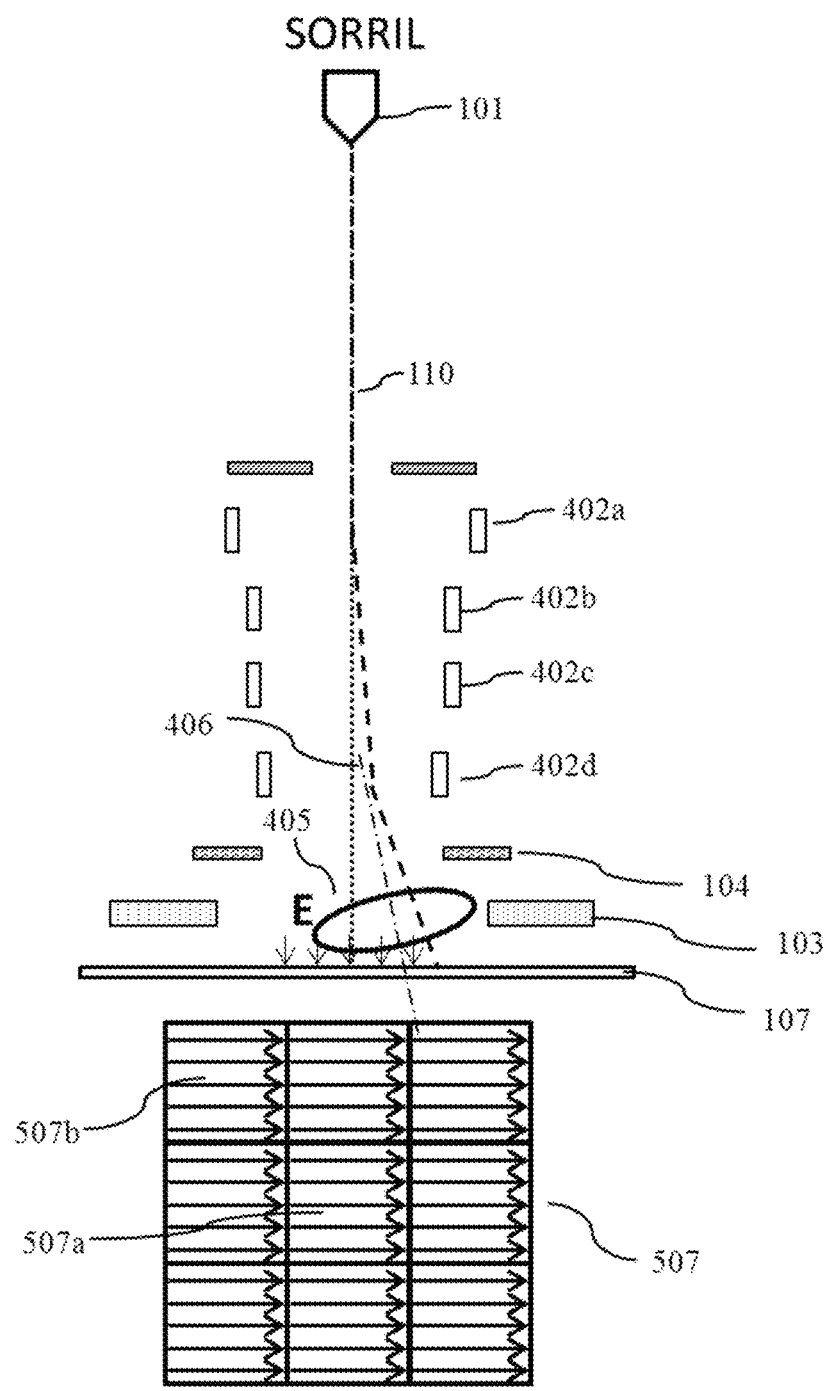
FIG. 10b is a diagram of SORRIL scanning according to an embodiment of the disclosure.

In another example, the deflection device includes four sub-deflectors 402a, 402b, 402c and 402d, as shown in FIG. 10a and FIG. 10b. The primary electron beam emitted from the electron source 101 is first deflected by the sub-deflectors 402a, 402b, and 402c to move far away from the optical axis 110, which is shown by 403 in FIG. 10a and FIG. 10b; and then is deflected by 402d.

In an embodiment of the disclosure shown in FIG. 10a, the deflection-control electrode 103 is supplied a scanning voltage by the power supply system to generate a scanning electric field, and the scanning electric field and a scanning electric field produced by the sub-deflector 402d and are coupled with the compound retarding receiving immersion lens field 405, as a consequence the optical axis 406 of the compound retarding receiving immersion lens field is shifted laterally and no longer coincides with the optical axis 110 of the system, and therefore a Moving Objective Retarding Receiving Immersion Lens (MORRIL) is formed. Since the optical axis 406 of the compound retarding receiving lens is shifted laterally, the off-axis aberration and deflection aberration are reduced when performing large scanning field imaging, and a high resolution can be achieved at the edge and center of the large field. As shown by 507 in FIG. 10a, the primary electron beam is deflected by sub-deflectors 402a, 402a, 402c and 402d and deflection-control electrode 103 to perform a large FOV raster scan, where 507a is the center of the scanning field, and 507b is a random point at the edge of the scanning field.

In another embodiment of the disclosure shown in FIG. 10b, the deflection-control electrode 103 is supplied a scanning voltage by the power supply system to generate a scanning electric field, and the scanning electric field and a scanning electric field produced by the sub-deflector 402d are coupled with the compound retarding receiving immersion lens field 405. With a coupling method different to that in FIG. 10a, the optical axis 406 of the compound retarding receiving immersion lens field swings and is no longer parallel with the optical axis 110 of the system, and therefore a Swing Objective Retarding Receiving Immersion Lens (SORRIL) is formed. Since the optical axis 406 of the compound retarding receiving lens swings, the off-axis aberration and deflection aberration are reduced when performing large scanning field imaging, and a high resolution can be achieved at the edge and center of the large field. As shown by 507 in FIG. 10*b*, the primary electron beam is deflected by sub-deflectors 402*a*, 402*b*, 402*c*, 402*d* and deflection-control electrode 103 to perform a large FOV raster scan, wherein 507*a* is the center of the scanning field, and 507*b* is a random point at the edge of the scanning field.

It is to be noted that, compared to the deflection device with two sub-deflectors, the large field scanning method using the deflection device with four sub-deflectors is performed as follows: firstly deflecting the primary electron beam to a starting position of a sub-zone (for example a sub-zone 507*b* at the top left corner of 507) under a deflection field formed by the sub-deflectors 402*a* and 402*d* and the deflection control electrode 103, and then performing fast scanning of this sub-zone with the sub-deflectors 402*b* and 402*c*, and secondly moving to a starting position of a next sub-zone under a deflection field formed by the sub-deflectors 402*a* and 402*d* and the deflection control electrode 103, and then performing fast scanning of this sub-zone with sub-deflectors 402*b* and 402*c*, and then performing fast scanning of this sub-zone with the sub-deflectors 402*b* and 402*c*, and so forth, a large scanning field 507 is finally formed.

Step S102, by controlling the voltages of the deflection control electrode, the signal electrons are received by the first sub-detector and the second sub-detector.

In this embodiment of the disclosure, the voltage of the specimen is set to V2, $0 \leq V2 \leq -5$ kV, the voltage of the first sub-detector is set to 0V, and the third voltage V3 is set to a constant value, $V2 \leq V3 \leq 0$.

In another embodiment, the voltage of the specimen V2 is set to zero, the voltage of the first sub-detector is set to V5, where V5 is no less than 5 kV and no more than 30 kV, and the third voltage V3 is set to a constant value, $0 \leq V3 \leq V5$.

Figure 11A:
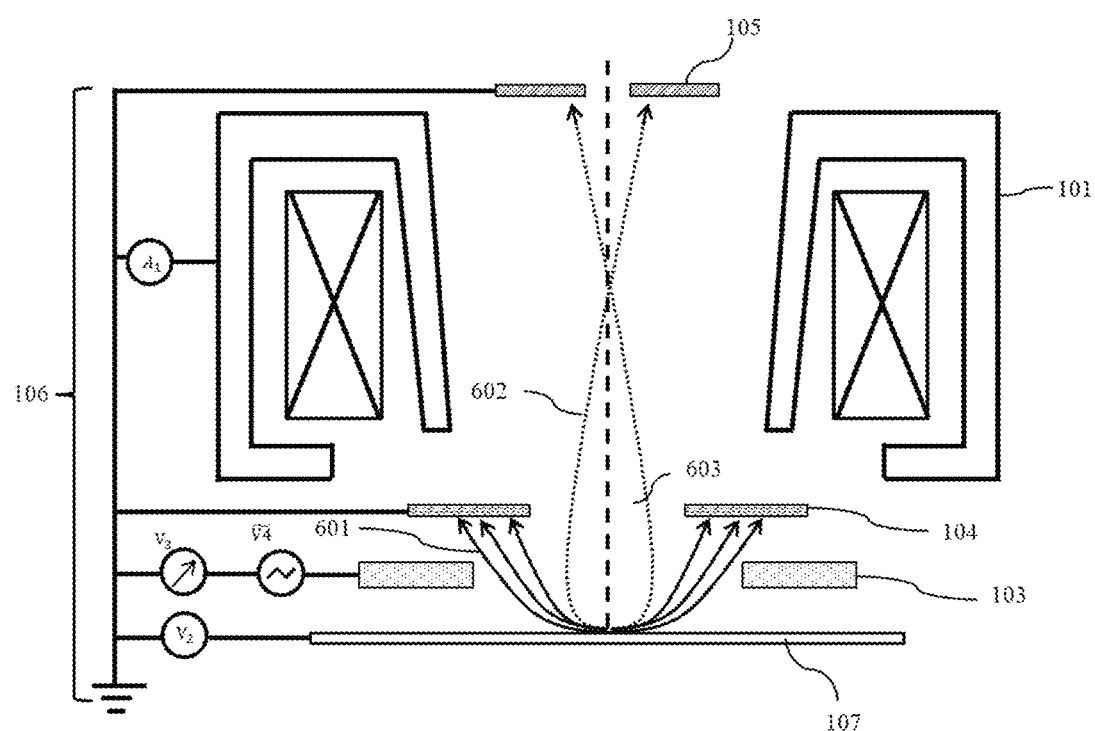
FIG. 11a is a diagram of detecting signal electrons generated at the center of the large scanning field.

FIG. 11*a* shows a diagram of detection of signal electrons (secondary electrons and back-scattered electrons) generated at the center of the large scanning field. This case is corresponding to the case in which the detection is performed on the signal electrons generated at the edge point 407*b* of the scanning field and nearby shown in FIG. 9*a* and FIG. 9*b*, and is also corresponding to the case in which the detection is performed on the signal electrons generated at the edge sub-area 507*b* of the scanning field shown in FIG. 10*a* and FIG. 10*b*. As shown in FIG. 11*a*, in this case, the backscattered electrons 601 emitted from the specimen are not converged, but are diffused and received by the first sub-detector 104; the secondary electrons 602 are converged by the compound retarding receiving immersion lens field and then go through the central hole 603 of the first detector 104, move upwardly and finally are received by the second sub-detector 105. In this embodiment, by adjusting the voltages V3 and V4 applied to the deflection control electrode, and the voltage V2 applied to the specimen, the trajectories of the backscattered electrons 601 and the secondary electrons 602 are adjusted accordingly, so that the signal electrons can be received by the detector with high efficiency in different conditions.

Figure 11B:
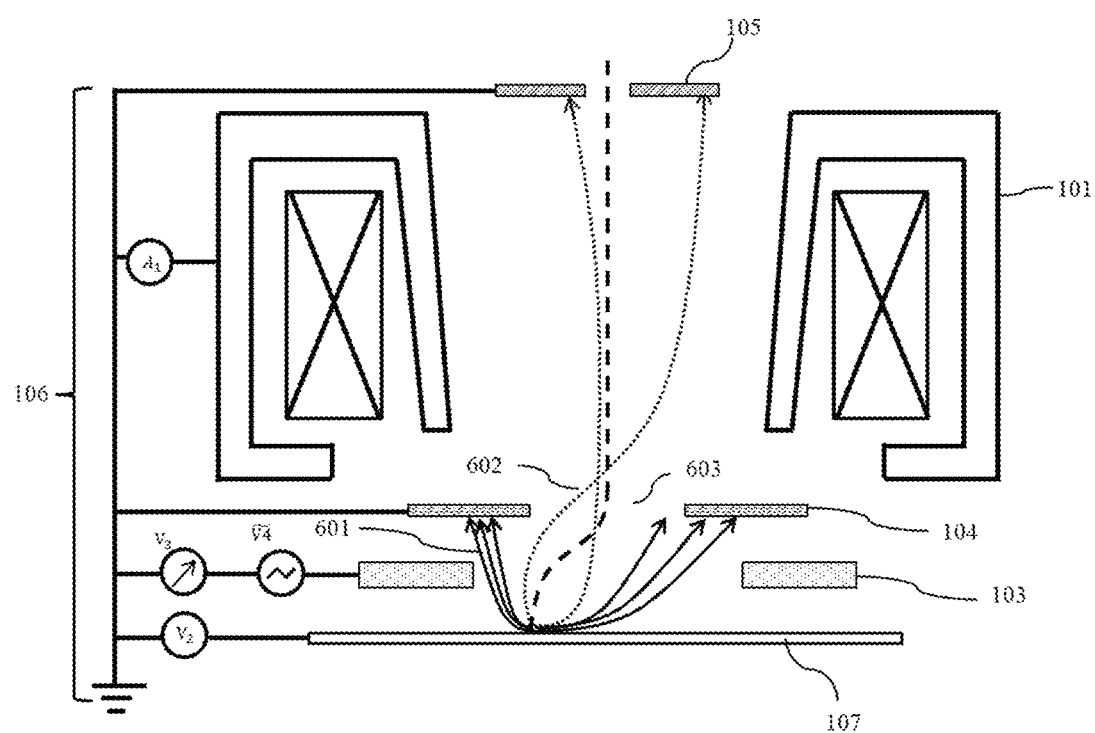
FIG. 11b is a diagram of detecting signal electrons generated at the edge of the large scanning field.

FIG. 11*b* shows a diagram of detection of signal electrons generated at the edge of the large scanning field. This case is corresponding to the case in which the detection is performed on the signal electrons generated at the edge point 407*b* of the scanning field and nearby shown in FIG. 9*a* and FIG. 9*b*, and is also corresponding to the case in which the detection is performed on the signal electrons generated at the edge sub-area 507*b* of the scanning field shown in FIG. 10*a* and FIG. 10*b*. In this embodiment of the disclosure, by adjusting the voltages V3 and V4 applied to the deflection control electrode, and the voltage V2 applied to the specimen, the trajectories of the backscattered electrons 601 and the secondary electrons 602 are adjusted accordingly, so that the signal electrons generated at the edge of the scanning field can also be received by the corresponding detector with high efficiency.

In conclusion, by adjusting the voltage of the deflection-control electrode, the signal electrons generated from both the center and the edge of the large scanning field can be received and detected with high efficiency.

What are described above are merely embodiments of the disclosure, and not intended to limit the scope of protection of the disclosure. One of ordinary skill in the art will readily recognize that there would be variations to the embodiments and those variations would be within the spirit and scope of the present disclosure. Therefore, the protection scope of the present disclosure should be subject to the protection scope of the claims.

INDUSTRIAL APPLICABILITY

With the scanning electron microscope objective lens system, as well as the large field of view scanning method according to the disclosure, the off-axis and deflection aberration is reduced, and therefore the high resolution at the edge of the large scanning field can be achieved. Since the BSE detector is designed with several sub-detection zones, the signal electrons emitted with different orientations or different angles are detected separately, with which images with different information can be achieved at the same time. With the flexibility of the deflection control electrode potential control, the deflection control electrode can act as both a deflector and an electrostatic lens electrode, so that the collection efficiency of the electron signals generated at the whole large scanning field is improved.

The invention claimed is:

1. A scanning electron microscope objective lens system, comprising: a magnetic lens, a deflection device, a deflection control electrode, a specimen to be observed and a detection device, wherein,
    an opening of a pole piece of the magnetic lens faces to the specimen;
    the deflection device is arranged in the magnetic lens, which contains at least one sub-deflector;
    the deflection control electrode is located between the detection device and the specimen, and is arranged to change a direction of a primary electron beam impinging on the specimen and change a direction of signal electrons generated, at the specimen, due to the impinging; and
    the detection device comprises a first sub-detector for detecting back-scattered electrons among the signal electrons and a second sub-detector for detecting secondary electrons among the signal electrons.

2. The scanning electron microscope objective lens system according to claim 1, wherein the deflection control electrode includes: a first central hole and a plurality of deflection control sub-electrodes; and
    the plurality of deflection control sub-electrodes are deployed around the first central hole.

3. The scanning electron microscope objective lens system according to claim 2, wherein the first sub-detector comprises a second central hole, a diameter of the second central hole is smaller than that of the first central hole.

4. The scanning electron microscope objective lens system according to claim 3, wherein the diameter of the second central hole is of an order of millimeters.

5. The scanning electron microscope objective lens system according to claim 1, wherein the first sub-detector includes at least one first sub-detection component; and
each of the first sub-detection components is arranged to acquire a signal corresponding to signal electrons of a respective zone and send the signal to an external image processing device to image the signal electrons of the respective zone.

6. The scanning electron microscope objective lens system according to claim 1, wherein the specimen to be observed is located on a specimen stage; and
the first sub-detector, the deflection control electrode, and the specimen stage are configured to, when powered by a power supply system, make up a retarding electrostatic lens field.

7. The scanning electron microscope objective lens system according to claim 6, wherein, the system further includes the power supply system, configured to power the specimen stage, the deflection control electrode, and the first sub-detector such that
a second voltage of the specimen stage is V2, where V2 is no less than −30 kilovolts (kV) and no more than 5 kV;
a voltage of the first sub-detector is 0 volt (V), the deflection control electrode is applied to a third voltage and a fourth voltage;
the third voltage V3 is constant, where V3 is no less than V2 and no more than 0; and
the fourth voltage V4 is an alternating voltage.

8. The scanning electron microscope objective lens system according to claim 1, wherein the system further includes a high voltage tube, and a central axis of the high voltage tube coincides with that of the magnetic lens.

9. The scanning electron microscope objective lens system according to claim 8, wherein the sub-deflectors are magnetic deflectors.

10. The scanning electron microscope objective lens system according to claim 8, wherein the system further includes a power supply system, configured to power the specimen stage, the deflection control electrode, and the first sub-detector such that a voltage of the specimen to be observed located on the specimen stage is 0V, the deflection control electrode is applied to a third voltage and a fourth voltage;
a voltage of the first sub-detector is V5, 5 kV≤V5≤30 kV
a third voltage V3 is constant, where V3 is no less than 0 and no more than V5;
a fourth voltage V4 is an alternating voltage.

11. A specimen detection method, applied to a scanning electron microscope objective lens system, wherein the method comprises:
forming a retarding electrostatic lens field by powering a first sub-detector for receiving back-scattered electrons, a deflection control electrode, and a specimen stage at which a specimen to be observed is located in the scanning electron microscope objective lens system;
forming a compound objective retarding immersion lens field by overlapping the retarding electrostatic lens field with a magnetic field produced by a magnetic lens in the scanning electron microscope objective lens system at a zone near the specimen;
making a primary electron beam to pass through the compound objective retarding immersion lens field;
controlling a deflection device in the scanning electron microscope objective lens system and the deflection control electrode to deflect the primary electron beam, wherein after the deflection, the primary electron beam impinges on the specimen to produce signal electrons; and
controlling a voltage of the deflection control electrode, such that the signal electrons are received by the first sub-detector and a second sub-detector in the scanning electron microscope system.

12. The method according to claim 11, further comprising:
controlling the voltage of the deflection device and the deflection control electrode to couple a deflection field formed by the deflection device and the deflection control electrode to the compound objective retarding immersion lens field, and achieve shifting objective retarding receiving lens field scanning of the specimen or swing objective retarding receiving lens field scanning of the specimen.

13. The method according to claim 12, wherein said controlling the voltage of the deflection device and the deflection control electrode to couple the deflection field to the compound objective retarding immersion lens field includes:
controlling the voltage of a sub-detector nearest to the specimen among a plurality of sub-detectors in the deflection device, and controlling the voltage of the deflection control electrode to couple the deflection field produced by the sub-deflector nearest to the specimen and the deflection control electrode with the compound objective retarding immersion lens field.

14. The method according to claim 11, wherein the method further comprises:
acquiring, by each of at least one first sub-detection component in the sub-detector, a signal corresponding to signal electrons of a respective zone, and sending the signal to an external image processing device to image the signal electrons of the respective zone.

15. The method according to claim 11, wherein
said forming the retarding electrostatic lens field comprises:
applying the deflection control electrode to a third voltage and a fourth voltage, wherein the fourth voltage is an alternating voltage;
setting a voltage of the specimen stage at which the specimen is located to be V2, where V2 is no less than −30 kilovolts (kV) and no more than 5 kV;
setting a voltage of the first sub-detector to be 0 volt (V), and setting the third voltage V3 to be a constant, where V3 is no less than V2 and no more than 0.

16. The method according to claim 11, wherein said forming the retarding electrostatic lens field comprises:
applying the deflection control electrode a third voltage and a fourth voltage, and the fourth voltage is an alternating voltage;
setting a voltage V2 of the specimen stage to be 0;
setting a voltage of the first sub-detector to be V5, where V5 is no less than 5 kV and no more than 30 kV, and
setting the third voltage V3 to be a constant, where V3 is no less than 0 and no more than V5.

* * * * *